United States Patent [19]

Kobayashi et al.

[11] Patent Number: 4,638,185
[45] Date of Patent: Jan. 20, 1987

[54] ANALOG SIGNAL MEASURING APPARATUS

[75] Inventors: Kensuke Kobayashi, Tokyo; Yasuo Tazoh, Kanagawa, both of Japan

[73] Assignees: Iwatsu Electric Co., Ltd.; Nippon Telegraph & Telephone Public Corporation, both of Tokyo, Japan

[21] Appl. No.: 670,622

[22] Filed: Nov. 13, 1984

[30] Foreign Application Priority Data

Nov. 15, 1983 [JP] Japan ................. 58-213289

[51] Int. Cl.⁴ ................. H03K 17/00; H03K 17/92
[52] U.S. Cl. ................. 307/352; 307/359; 307/306; 328/151
[58] Field of Search ............... 307/277, 306, 352, 353, 307/462, 359; 357/5; 328/146, 147, 150, 151

[56] References Cited

U.S. PATENT DOCUMENTS

| | | | |
|---|---|---|---|
| 3,938,503 | 2/1976 | Vis | 328/150 |
| 4,245,169 | 1/1981 | Hamilton . | |
| 4,268,863 | 5/1981 | Los | 328/150 |
| 4,387,465 | 6/1983 | Becker | 307/352 |

OTHER PUBLICATIONS

S. M. Faris, Appl. Phys. Lett. 36(12), pp. 1005–1007, 1980.

D. B. Tuckerman, Appl. Phys. Lett. 36(12), pp. 1008–1010, 1980.

Primary Examiner—John Zazworsky
Attorney, Agent, or Firm—Blakely, Sokoloff, Taylor & Zaeman

[57] ABSTRACT

An analog signal measuring apparatus has: a sampling gate circuit, having a plurality of input terminals including an analog signal input terminal and a feedback signal input terminal, for generating an output signal of high or low level when a sum of input signals goes beyond or falls below a predetermined threshold value; a signal generating circuit, connected to an output terminal of the sampling gate circuit, for changing an output signal by a predetermined level toward a direction in which an output signal level of the sampling gate circuit is inverted when a trigger signal is applied to the signal generating circuit, and for supplying a feedback signal to the feedback signal input terminal of the sampling gate circuit; and a read circuit for generating a value obtained when the feedback signal from the signal generating circuit converges, the feedback signal corresponding to a value of an analog signal supplied to the analog signal input terminal, wherein a ratio of an increment $\Delta I0$ to a decrement $\Delta I1$ in a change in the output from the signal generating circuit is controlled in response to a control signal.

3 Claims, 11 Drawing Figures

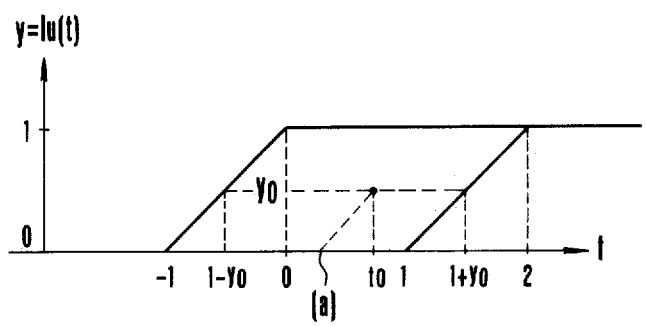
F I G. 3A
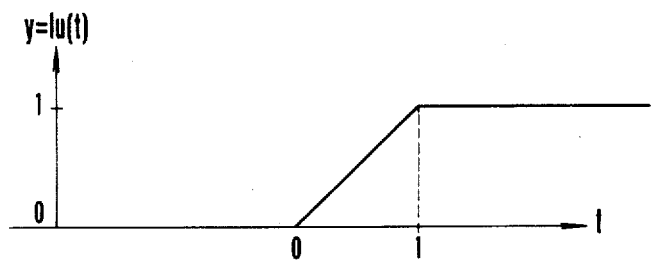
F I G. 3B
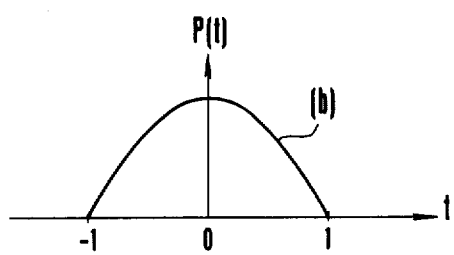
F I G. 3C

ANALOG SIGNAL MEASURING APPARATUS

BACKGROUND OF THE INVENTION

The present invention relates to an analog signal measuring apparatus and, more particularly, to an analog signal measuring apparatus capable of arbitrarily setting a transition probability of a sampling gate in response to a control signal.

Josephson junction devices have a higher switching speed and a lower noise than those of conventional semiconductor devices. Various studies have been extensively made in development of Josephson samplers for sampling a high-speed signal (i.e., a switching characteristic of the Josephson junction device).

Typical examples of these various studies are given as follows:

(1) S.M. Faris, Appl. Phys. Lett. 36 (12), pp. 1005–1007, 1980

(2) D.B. Tuckerman, Appl. Phys. Lett. 36 (12), pp. 1008–1010, 1980

(3) C. Hamilton, U.S. Pat. No. 4,245,169, Jan. 13, 1981.

A sampling gate composed of a Josephson junction device is illustrated in FIG. 1, and a conventional analog signal measuring apparatus using the Josephson sampling gate of FIG. 1 is illustrated in FIG. 2. The principle of sampling will be described with reference to FIGS. 1 and 2.

The sampling gate shown in FIG. 1 has magnetic coupling lines for receiving a sampling pulse Ip, a signal Iu to be measured, and a bias current IM. When these input signals are added, and the sum exceeds a threshold current Ic determined by a device current Ib, an output of logic "1" (voltage state: an output of several millivolts) is generated. When the sum is lower than the threshold current Ic, the sampling gate generates an output of logic "0" (superconductive state: an output of 0 mV). Reference symbol OUT1 denotes an output terminal at which the sampler output appears.

A signal generator SGC in the analog signal measuring apparatus in FIG. 2 slightly changes a bias (feedback) current IM in accordance with an output state of a sampling gate circuit SPGC. When a sampling gate SPGC generates an output of logic "1", the bias current IM changes toward a direction in which the output of the sampling gate SPGC is brought to logic "0". Conversely, when the sampling gate SPGC generates an output of logic "0", the bias current IM changes toward a direction in which the output of the sampling gate SPGC is brought to logic "1". In this manner, sampling operation is repeated, and the bias current IM is converged to a value below:

$$Iu + Ip + IM = Ic \quad (1)$$

When the sampling pulse Ip and the gate threshold current Ic are given to be constant, the signal Iu corresponds to a converged value (i.e., the output from the signal generator SGC) of the bias current IM. When time for supplying the sampling pulse Ip is sequentially delayed with respect to the waveform Iu(t) of the signal to be measured, the instantaneous values at different times of the waveform Iu(t) can be sampled. This sampling technique is the same as the conventional sampling technique.

Referring to FIG. 2, reference symbol SPG denotes a sampling pulse generator for generating the sampling pulse Ip; and ST, a trigger signal for triggering the sampling pulse generator SPG and the signal generator SGC. The sampling gate circuit SPGC constitutes a comparing means which has a plurality of input terminals including a terminal for receiving an analog signal Iu to be measured and a terminal for receiving a bias (feedback) current IM. Each time the sum of all input signals supplied to the input terminals of the comparing means goes beyond or falls below a predetermined threshold value, the output level of the comparing means goes high or low. The signal generator SGC constitutes an integrating means. The integrating means is connected to the output terminal of the sampling gate circuit SPGC. When the trigger signal ST is supplied to the integrating means, the integrating means changes its output signal to generate the bias (feedback) current IM so as to invert the output level of the sampling gate circuit SPGC. The output signal (bias current) from the integrating means is fed back to the input terminal of the sampling gate circuit SPGC. Reference symbol ROC denotes a read circuit for reading out the output from the signal generator SGC in response to a read command signal RCS. The read circuit ROC constitutes a reading means for generating a value corresponding to that of the signal Iu when the output signal from the signal generator SGC in the integrating means is converged.

However, in the conventional analog signal measuring apparatus, a probability (to be referred to as a transition probability hereinafter) for causing the sampling gate to generate an output of logic "1" or "0" is set at approximately ½ when the bias current IM supplied as the feedback signal from the signal generator SGC to the sampling gate circuit SPGC is converged. The transition probability cannot be accurately or arbitrarily set.

For example, in a conventional sampling apparatus proposed by C. Hamilton, the bias current IM is read out when the output from the sampling gate is inverted from logic "0" to logic "1". The transition probability at the time of convergence of the bias current IM is not considered.

In a sampling apparatus proposed by D.B. Tuckerman, the transition probability is set to ½. However, in order to accurately set the transition probability to ½, a sampling gate output at the time of convergence of the bias current IM must be monitored, and a reference voltage must be adjusted such that the number of outputs of logic "1" becomes ½ of the number of times of sampling. In this sampling apparatus, when any one of the conditions such as a sampling period, a pulse width of the device current Ib, a delay time of the sampling pulse Ip with respect to the device current Ib, and a gate output changes, it is impossible to accurately and arbitrarily set the transition probability.

A technique for realizing a general-purpose Josephson sampling apparatus which eliminates the indefinite factors for the transition probability and which assures desired setting of the transition probability even if the conditions change is described by Tazoh et al., "Josephson Sampling Technique and its Application", Proceedings of the Institute of Electronics Engineers, Ed. 83–63, p. 49.

In a Josephson sampling apparatus described in the above proceedings, the drawbacks of the sampling apparatus proposed by Tuckerman can be eliminated, i.e., even if the Tuckerman's conditions described above change, the transition probability will not change (in the proceedings, 50%). But it is not an apparatus that can set the transition probability accurately and arbitrarily.

SUMMARY OF THE INVENTION

It is an object of the present invention to provide a simple analog signal measuring apparatus capable of accurately and arbitrarily setting a transition probability of a sampling gate.

It is another object of the present invention to provide an analog signal measuring apparatus capable of measuring a jitter distribution of a signal to be measured.

It is still another object of the present invention to provide an analog signal measuring apparatus capable of easily measuring an average skew between a plurality of signals and minimum and maximum time differences between the signals.

In order to achieve the above objects of the present invention, there is provided an analog signal measuring apparatus having: comparing means, having a plurality of input terminals including an analog signal input terminal and a feedback signal input terminal, for generating an output signal of high or low level when a sum of input signals goes beyond or falls below a predetermined threshold value; integrating means, connected to an output terminal of the comparing means, for changing an output signal by a predetermined level toward a direction in which an output signal level of the comparing means when a trigger signal is applied to the integrating means, and for supplying a feedback signal to the feedback signal input terminal of the comparing means; and reading means for generating a value obtained when the feedback signal from the integrating means converges, the feedback signal corresponding to a value of an analog signal supplied to the analog signal input terminal, wherein a ratio of an increment $\Delta I0$ to a decrement $\Delta I1$ in a change in the output from the integrating means is controlled in response to a control signal.

BRIEF DESCRIPTION OF THE DRAWINGS

FIGS. 3A to 3C are respectively graphs for explaining the relationship between the signal to be measured and the jitter distribution;

DETAILED DESCRIPTION OF THE PREFERRED EMBODIMENT

The present invention will be described in detail with reference to a preferred embodiment.

In order to best understand the present invention, the importance of a transition probability in a sampling apparatus will be described.

Figure 1:
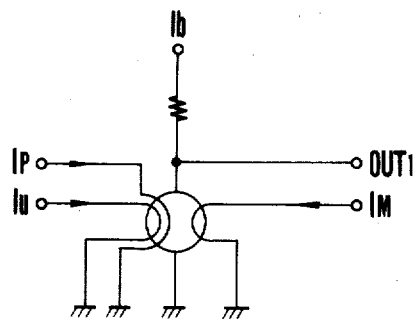
FIG. 1 is a diagram showing a sampling gate composed of a Josephson junction device.
Figure 2:
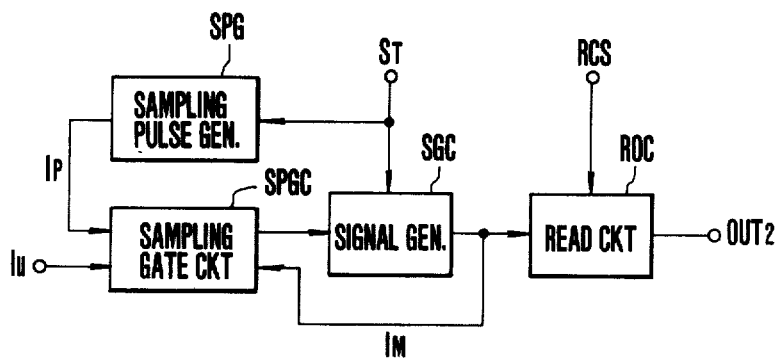
FIG. 2 is a block diagram of a conventional analog signal measuring apparatus using the sampling gate of FIG. 1.

A Josephson sampling apparatus serves to measure a waveform of a pulse switched at a high speed. More specifically, the Josephson sampling apparatus mainly measures a transition time of the pulse waveform and a time difference between a plurality of pulse waveforms. The transition probability of the sampling gate becomes important when a time difference between the pulses having jitter with respect to a sampling pulse Ip (FIGS. 1 and 2) is measured.

The relationship between the waveform of the signal to be measured and the jitter distribution will be described with reference to FIGS. 3A to 3C. FIG. 3A shows a signal (to be measured) including jitter, FIG. 3B shows the signal (to be measured) without jitter, and FIG. 3C shows the probability density distribution P(t) of jitter. By way of simplicity, assume that jitter is distributed symmetrically about $t=0$ in the range of $-1 \leq t \leq 1$, and that the signal to be measured changes linearly at a rate ½ of the peak-to-peak value of jitter.

A distribution Q(y) of the signal waveform $y$ $(=Iu(t))$ at $t=t0$ under the above conditions will be described.

By the relationship between y0 and t0 in FIG. 3A, y0 is obtained at $t=t0$ when the signal $y=Iu(t)$ rises at $t=y0-t0$ (a in FIG. 3A). Therefore, equation (2) is established:

$$Q(y0) = P(y0 - t0) \qquad (2)$$

for $0 \leq y0 \leq 1$ and $-1 \leq y0-t0 \leq 1$. The probability density distribution P(t) (b in FIG. 3C) is:

$$\int_{-1}^{1} P(t)dt = 1$$

$$P(t) = P(-t)$$

Figure 4:
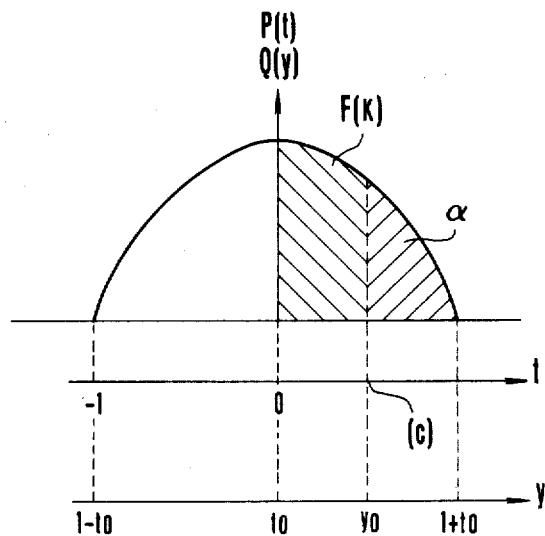
FIG. 4 is a graph for explaining the relationship between the value measured and the jitter distribution.

The relationship between the amplitude and the jitter distribution is illustrated in FIG. 4 and presents equation (2).

When the device current Ib of the sampling gate is controlled to establish relation Ic=Ip, a converged value of the bias current IM becomes $IM = -Iu$ according to relation (1).

However, the value of the signal Iu at $t=t0$ has the probability distribution given by equation (2). If a probability for the sampling gate output of logic "1" at a converged value $-y0$ of the bias current IM is given as $\alpha$ (corresponding to a hatched portion $\alpha$ in FIG. 4), equation (3) is established:

$$\alpha = \int_{y0}^{1+t0} Q(y)dy = \int_{y0-t0}^{1} P(t)dt \qquad (3)$$

Taking F(t) for $\int p(t)dt$, the probability distribution P(t) is an even function within the range of $-1 \leq t \leq 1$, therefore, $$F(1) = -F(-1) = \tfrac{1}{2} \text{ and } F(0) = 0$$

The results yield equation (4) below:

$$F(y0-t0) = \tfrac{1}{2} - \alpha = F(k) \qquad (4)$$

Referring to FIG. 4, a hatched portion F(k) corresponds to F(k) in equation (4), and point c is given by $y0-t0$.

A locus of the measuring result y0 becomes $y0 = t0 + k$ when the bias current IM is converged to obtain the given transition probability α in accordance with equation (4). As indicated by the relationship between the signal waveform Iu(t) and the measured result y0 in FIG. 5, the same measuring result as the leading edge of the signal waveform Iu(t) is obtained.

Figure 5:
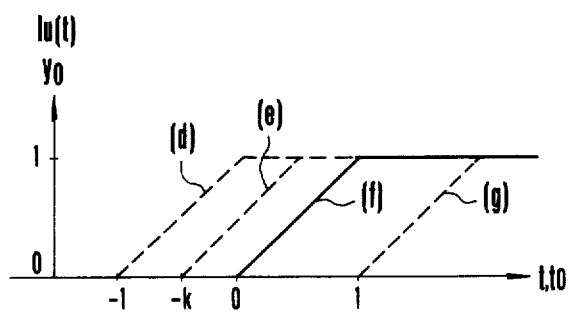
FIG. 5 is a graph for explaining the relationship between the signal waveform to be measured and the measuring result.

Referring to FIG. 5, a dotted line d represents α=0, a dotted line e represents y=t0+k, a solid line f represents α=½, and a dotted line g represents α=1.

When the transition probability α is given as ½, y0=t0 is established in accordance with equation (4) and F(0)=0. The signal waveform Iu(t) coincides with the measuring result y0. When the transition probability α becomes 0, y0=t0+1 is established in accordance with F(y0−t0)=½(F(1). When the transition probability α becomes 1, y0=t0−1 is established in accordance with F(y0−t0)=−½=F(−1). Therefore, an envelope of the signal Iu including jitter is obtained. This result is illustrated in FIG. 5.

The relationship between jitter and shift k as a function of time will be described. An accumulated jitter distribution function R(t) at t=0 is given as follows:

$$R(t) = -R(-t) = 2 \int_0^t P(t)dt \quad (5)$$

The function R(t) is given as a function of the jitter of the leading edge of the signal waveform Iu(t) between the zero value and the peak value.

A rising portion of the measuring result y0 is given under the condition y0=0 in the following manner:

$$F(-t0) = \tfrac{1}{2} - \alpha = \int_0^1 P(t)dt - \int_{-t0}^1 P(t)dt$$

$$= \int_0^{-t0} P(t)dt = F(k)$$

Therefore, equation (6) is derived as follows:

$$R(-k) = 2F(-k) = 2\int_0^{t0} P(t)dt = 1 - 2\alpha \quad (6)$$

for 0≦α≦½.

Equation (6) entails the following conclusion.

The leading edge of the waveform shifts by k from t=0 which is the center of jitter when the transition probability is α. An accumulated distribution of the jitter of the signal Iu between zero value and the center peak value becomes 1−2α at t=−k.

As is apparent from the above description, the transition probability α becomes an important parameter with respect to the signal with jitter.

The analog signal measuring apparatus of the present invention is a sampling apparatus in which the shift of the waveform as a function of time due to the presence of jitter provides an accumulated distribution, according to the arbitrarily set transition probability and the stable preset value.

A method of setting the transition probability α will be described.

Assume that a step-up amount of an output current from the integrator is given as ΔI0 when the sampling gate generates an output of level "0", and that a step-down amount of an output current from the integrator is given as ΔI1 when the sampling gate generates an output of level "1". Also assume that the sampling pulse Ip in relation (1) satisfies relation Ip=Ic (gate threshold current).

When relations Iu>0 and IM=0 are established and sampling is performed, the sampling gate generates an output of "1" level since Ic−Ip−Iu−IM<0 is established, so that IM=−ΔI1 is obtained. When sampling is continuously performed and relation |Iu|<|IM| is established, inequality Ic−Ip−Iu−IM>0 is given, and the sampling gate generates an output of level "0". As a result, the integrator increases its output by ΔI0. Sampling is repeated an appropriate number of times after the gate output is inverted, and a change in bias current IM falls within the range of an absolute value of a larger step amount between ΔI0 and ΔI1. In other words, the bias current IM becomes converged.

Thereafter, sampling is further repeated by N times. In this state, assume that the number of times of outputs of logic "1" from the sampling gate is given as N1, and the number of times of outputs of logic "0" from the sampling gate is given as N0. A bias current IMN obtained after N-time sampling has the following relationship with a bias current IM0 at N=0: IMN=ΔI0×N0−ΔI1×N1+IM0.

On other hand, since the bias currents IMN and IM0 are already converged, $$|\Delta I0 \times N0 - \Delta I1 \times N1| = |IMN - IM0| \approx \Delta I$$

where ΔI is a larger value among ΔI0 and ΔI1. When the right- and left-hand sides of the above equation are divided by N and N>>1 is given, the term ΔI/N becomes very small. Therefore, the following relation is given: ΔI0×N0/N=ΔI1×N1/N.

The transition probability α is given as N1/N when the bias current IM is converged, thereby deriving equation (7) below:

$$\alpha = \Delta I0/(\Delta I1 + \Delta I0) \quad (7)$$

By equation (7), the transition probability of sampling can be set in accordance with an increase and a decrease in output from the integrator.

Figure 6:
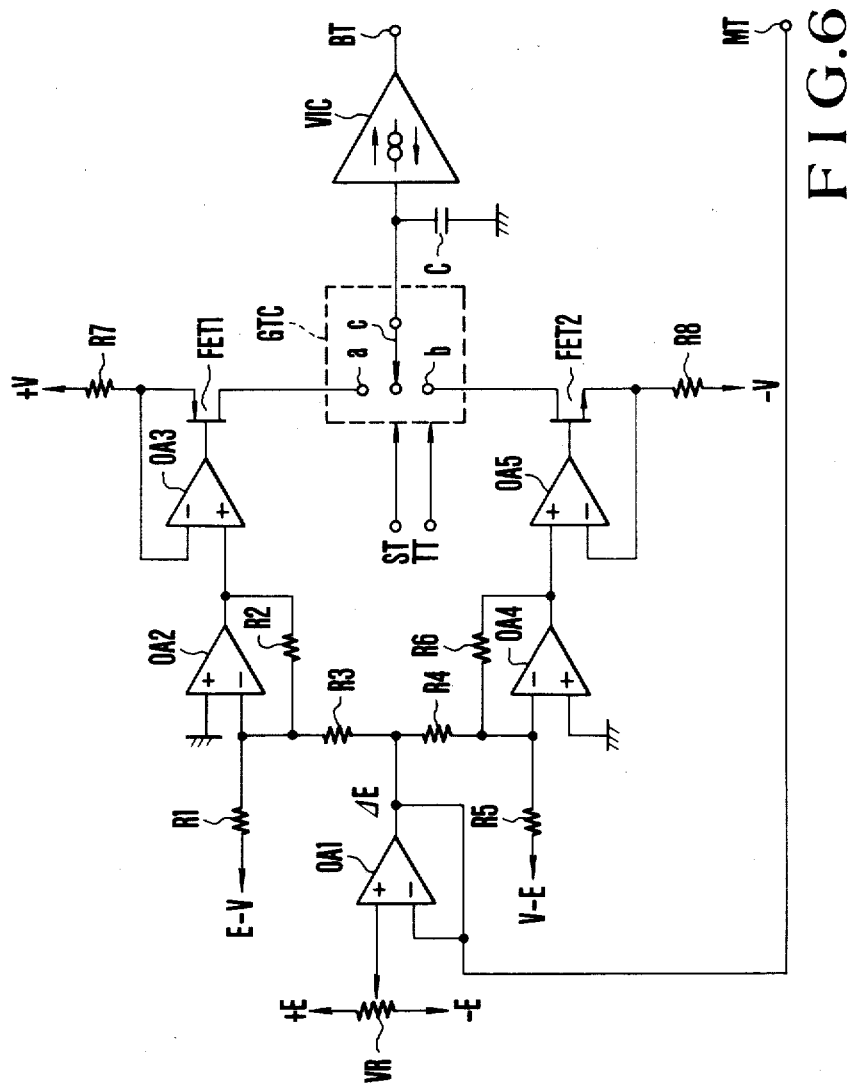
FIG. 6 is a block diagram of an integrator used in an analog signal measuring apparatus according to the present invention.

FIG. 6 is a block diagram of an integrator used in the present invention. A jitter accumulation distribution can be directly read.

Referring to FIG. 6, reference numerals OA1, OA2, ..., and OA5 denote operational amplifiers, respectively; VR, a variable resistor connected between power source voltages +E and −E; and R1, R2, ..., and R8, resistors, respectively. The resistors R1 to R6 have the same resistance. The resistor R7 has the same resistance as the resistor R8. Reference symbol FET1 denotes an n-type field effect transistor; FET2, a p-type field effect transistor; and GTC, a gate circuit. The gate circuit GTC is operated such that a contact c thereof is switched to a contact a thereof when a sampling gate output from the sampling gate to an input terminal ST of the gate circuit GTC is set at logic "1" and a trigger signal is being received at an input terminal TT, and such that the contact c is switched to a contact b when the sampling gate output is set at logic "0" and the trigger signal is being received at the input terminal.

Reference symbol C denotes an integrating capacitor connected to the contact c of the gate circuit GTC; VIC, a voltage-current converter for receiving a voltage appearing at the terminals of the integrating capacitor C and converting this voltage to a current; BT, an output terminal of the bias current IM; and MT, a monitor output terminal.

A noninverting terminal (+) of the operational amplifier OA1 is connected to a slider of the variable resistor VR, and an inverting terminal (−) of the operational amplifier OA1 is connected to the monitor output terminal MT. The output terminal of the operational amplifier OA1 is connected to the inverting terminal (−) thereof. The noninverting terminal (+) of the operational amplifier OA2 is grounded, and the inverting terminal (−) thereof is connected through the resistor R1 to a terminal which receives an input voltage E−V. The output terminal of the operational amplifier OA2 is connected to the inverting terminal (−) thereof through the resistor R2 and to the output terminal of the operational amplifier OA1 through the resistor R3. The noninverting terminal (+) of the operational amplifier OA3 is connected to the output terminal of the operational amplifier OA2. The inverting terminal (−) of the operational amplifier OA3 is connected to a positive power source terminal +V through the resistor R7. The noninverting terminal (+) of the operational amplifier OA4 is grounded, and the inverting terminal (−) thereof is connected through the resistor R5 to a terminal which receives an input voltage V−E. The inverting terminal (−) of the operational amplifier OA4 is connected to the output terminal of the operational amplifier OA1 through the resistor R4 and the output terminal of the operational amplifier OA4 is connected to the inverting terminal (−) through the resistor R6. The noninverting terminal (+) of the operational amplifier OA5 is connected to the output terminal of the operational amplifier OA4 and the inverting terminal (−) of the operational amplifier OA5 to a negative power source terminal −V through the resistor R8.

The source of the n-type field effect transistor FET1 is connected to the positive power source terminal +V through the resistor R7. The drain of the transistor FET1 is connected to the contact a of the gate circuit GTC. The gate of the transistor FET1 is connected to the output terminal of the operational amplifier OA3. The drain of the p-type field effect transistor FET2 is connected to the contact b of the gate circuit GTC. The source of the transistor FET2 is connected to the negative power source terminal −V through the resistor R8, and the gate of the transistor FET2 is connected to the output terminal of the operational amplifier OA5.

The integrator shown in FIG. 6 is operated such that a ratio of "1" level outputs to "0" level outputs at the time of convergence of the bias current IM of the prestage comparing means changes in accordance with a control signal.

The operation of the integrator shown in FIG. 6 will now be described.

By adjusting the variable resistor VR, a voltage $\Delta E$ appears at the monitor output terminal MT through the operational amplifier OA1 having a gain of 1. The voltage $\Delta E$ is applied to the inverting terminal (−) of the operational amplifier OA2 and is added to another input voltage E−V supplied to the inverting terminal (−) thereof through resistor R1. Therefore, a voltage V−E−$\Delta E$ appears at the output terminal of the operational amplifier OA2.

This voltage V−E−$\Delta E$ appears at the junction between the resistor R7 and the source of the transistor FET1 through the operational amplifier OA3 and the transistor FET1. If the resistance of the resistor R7 is given as 1 ohm, the transistor FET1 generates a current from its drain as follows:

$$I+ = V-(V-E-\Delta E) = E+\Delta E$$

The same operation as described above can be applied to the operational amplifiers OA4 and OA5 and the transistor FET2, so that $$I- = (-V+E-\Delta E)-(-V) = E-\Delta E$$

One of the currents I+ and I− is selected by a switching state of the gate circuit GTC. The selected output flows in the integrating capacitor C. When the current I+ is selected, the voltage increases. However, when the current I− is selected, the voltage decreases. A voltage across the terminals of the integrating capacitor C is converted by the voltage-current converter VIC to a current. The resultant current is fed back as the bias current IM to the sampling gate circuit (SPGC in FIG. 1).

Each time the trigger signal is applied to the gate circuit GTC, the output signal from the converter VIC is changed by a predetermined value toward a direction in which the output level of the sampling gate is inverted and fed back, as the bias current IM, to the input terminal of the sampling gate circuit.

As is apparent from the above description, the step-up amount $\Delta I0$ is proportional to the current I+, and the step-down amount $\Delta I1$ is proportional to the current I−, so that $$\Delta I0 = K \cdot (E+\Delta E) \text{ and } \Delta I1 = K \cdot (E-\Delta E)$$

where K is a constant.

The substitution of the above values into equation (7) and of the resultant value $\alpha$ into equation (6) yields the following relation:

$$R(-k) = -\Delta E/E$$

The shift k of the waveform as a function of time for $\Delta E = 0$ is read at a display (not shown) of the sampling apparatus, so that the accumulated distribution $\Delta E/E$ corresponding to the shift k can be immediately obtained.

Figure 7A:
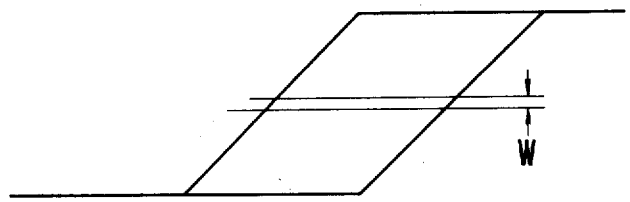
FIGS. 7A to 7C graphically show the effect of the present invention in comparison with the conventional apparatus.
Figure 7B:
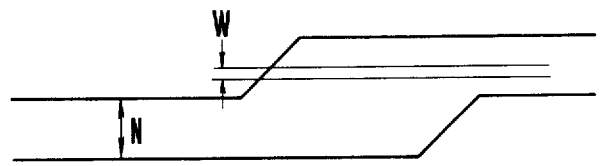
Figure 7C:
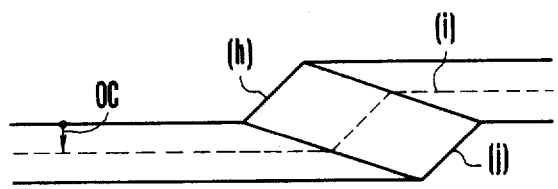

FIGS. 7A, 7B and 7C show waveforms of signals for explaining jitter measurement. FIGS. 7A and 7B show examples of jitter measurements by using conventional diode gate sampling apparatuses, respectively. FIG. 7C shows a case of jitter measurement according to the present invention. It should be noted that the example in FIG. 7B indicates that the input signal to be measured is very small.

In the conventional jitter measurement as shown in FIG. 7A, a window having a width W is provided at a proper level of the leading edge of the waveform. The number of sampling values falling within this window is accumulated for every sampling cycle so as to obtain the jitter distribution. However, when the signal has a high speed and a smaller amplitude, due to inherent equipment noise N the window W cannot be set only at the leading edge of the waveform. As a result, jitter measurement cannot be performed.

However, according to this embodiment, the signal level and time base components of the signal to be measured can be averaged without decreasing the slope of the leading edge. By changing the transition probability α, the waveform shown in FIG. 7C can be obtained. A shift of the signal level component which is caused by a change in transition probability can be cancelled by superposing an offset current OC on the bias current IM. In FIG. 7C, a line h is obtained for $\alpha=1$; i, for $\alpha=\frac{1}{2}$; and j, for $\alpha=0$.

Although omitted in the above description, when a superposed signal having a noise level higher than that of system noise of the analog signal measuring apparatus is measured, a noise accumulation distribution can be calculated in accordance with the shift of a vertical position of the signal and the transition probability of the sampling gate in the same manner as in jitter measurement.

As apparent from the above description, the apparatus according to this embodiment has the following advantages over conventional apparatuses.

First, in order to measure an accurate delay time difference between the waveforms without causing shift of the waveform by jitter, a transition probability of the sampling gate can be easily and accurately set to $\frac{1}{2}$. Second, the jitter distribution of the signal to be measured can be measured. Third, by combining the first and second effects, unlike the conventional Josephson sampling apparatus, the average skew and maximum and minimum time differences between a plurality of signals can be easily measured, thereby obtaining important information about timing set of logic circuits.

According to the present invention, the analog signal measuring apparatus has many advantages over conventional apparatus such that the transition probability of the sampling gate can be determined by the control signal.

What is claimed is:

1. An analog signal measuring apparatus for measuring an analog signal inputted thereto comprising:
   a sampling pulse generating means responsive to a trigger signal supplied thereto to generate a sampling pulse signal;
   a sampling gate means having, means for obtaining a sum signal representing the sum of an analog signal to be measured, a feedback signal and said sampling pulse signal and means for comparing a level of said sum signal with a predetermined threshold level to output a compared signal which has a high or low level;
   an integrating means supplied with said compared signal and said trigger signal, for producing said feedback signal which is fed back to said sampling gate means, said integrating means being controlled in accordance with a control signal so that, upon reception of said trigger signal, said feedback signal is increased or decreased so as to invert said compared signal, thereby said feedback signal converging to a value;
   a control means for providing said control signal to said integrating means; and
   a reading means for reading out the converged value of said feedback signal outputted from said integrating means.

2. The apparatus according to claim 1 wherein said integrating means comprises;
   first current generating means for generating a first current;
   second current generating means for generating a second current;
   a gate means which is selectively connected with one of said first and second current generating means in accordance with said compared signal and outputs a current selected from one of said first and second current generating means only during the period of time of said trigger signal;
   a capacitor for integrating the outputted current from said gate means; and
   an output buffer eans for converting a voltage of said capacitor to the output current of said integrating means, said output current being increased and decreased in accordance with said first current and second current, respectively.

3. The apparatus according to claim 2 wherein said control means comprises:
   first driving means for driving said first current generating means;
   second driving means for driving said second current generating means; and
   an adjusting means connected with said first and second driving means for causing an increment or a decrement of said first current and an increment or a decrement of said second current coincident with each other, thereby changing an increment or decrement of the output of said integrating means.

* * * * *

UNITED STATES PATENT AND TRADEMARK OFFICE
CERTIFICATE OF CORRECTION

PATENT NO. : 4,638,185

DATED : 1/20/87

INVENTOR(S) : KOBAYASHI ETAL.

It is certified that error appears in the above-identified patent and that said Letters Patent is hereby corrected as shown below:

| COLUMN | LINE | DESCRIPTION |
|---|---|---|
| 4 | 65 | delete "c" insert --$\underline{c}$-- |
| 5 | 6 | delete "d" insert --$\underline{d}$-- |
| 5 | 7 | delete "e" insert --$\underline{e}$-- |
| 5 | 8 | delete "g" insert --$\underline{g}$-- |
| 5 | 7 | delete "f" insert --$\underline{f}$-- |
| 5 | 47 | delete "k" insert --$\underline{k}$-- |
| 6 | 56 | delete "c" insert --$\underline{c}$-- |
| 6 | 57 | delete "a" insert --$\underline{a}$-- |
| 6 | 61 | delete "c" insert --$\underline{c}$-- |
| 6 | 61 | delete "b" insert --$\underline{b}$-- |
| 6 | 65 | delete "c" insert --$\underline{c}$-- |
| 7 | 40 | delete "a" insert --$\underline{a}$-- |

UNITED STATES PATENT AND TRADEMARK OFFICE
CERTIFICATE OF CORRECTION

PATENT NO. : 4,638,185            Page 2 of 2

DATED : 1/20/87

INVENTOR(S) : KOBAYASHI ET AL.

It is certified that error appears in the above-identified patent and that said Letters Patent is hereby corrected as shown below:

| COLUMN | LINE | DESCRIPITION |
|---|---|---|
| 7 | 44 | delete "b" insert --$\underline{b}$-- |
| 8 | 42 | delete "k" insert --$\underline{k}$-- |
| 8 | 45 | delete "k" insert --$\underline{k}$-- |
| 9 | 5 | delete "h" insert --$\underline{h}$-- |
| 9 | 5 | delete "i" insert --$\underline{i}$-- |
| 9 | 6 | delete "j" insert --$\underline{j}$-- |
| 10 | 29 | delete "eans" insert--means-- |

Signed and Sealed this

Fifth Day of July, 1988

*Attest:*

DONALD J. QUIGG

*Attesting Officer*      *Commissioner of Patents and Trademarks*